United States Patent
Cousins

(10) Patent No.: US 8,062,693 B2
(45) Date of Patent: Nov. 22, 2011

(54) GENERATION OF CONTACT MASKS FOR INKJET PRINTING ON SOLAR CELL SUBSTRATES

(75) Inventor: Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 486 days.

(21) Appl. No.: 12/234,970

(22) Filed: Sep. 22, 2008

(65) Prior Publication Data

US 2010/0075234 A1 Mar. 25, 2010

(51) Int. Cl.
 *B05D 1/26* (2006.01)

(52) U.S. Cl. .......... 427/58; 427/256; 427/261; 427/282; 427/287

(58) Field of Classification Search .............. 427/58, 427/261, 282, 287
See application file for complete search history.

(56) References Cited

U.S. PATENT DOCUMENTS

| | | | |
|---|---|---|---|
| 4,478,879 A | 10/1984 | Baraona et al. | |
| 6,096,968 A | 8/2000 | Schlosser et al. | |
| 6,271,087 B1 * | 8/2001 | Kinoshita et al. | 438/258 |
| 6,278,054 B1 | 8/2001 | Ho et al. | |
| 6,552,414 B1 | 4/2003 | Horzel et al. | |
| 6,849,308 B1 * | 2/2005 | Speakman et al. | 427/595 |
| 6,872,321 B2 | 3/2005 | Thavarajah et al. | |
| 7,198,821 B2 * | 4/2007 | Furusawa et al. | 427/256 |
| 7,280,235 B2 | 10/2007 | Lapstun et al. | |
| 7,281,786 B2 | 10/2007 | Silverbrook | |
| 7,292,368 B2 | 11/2007 | Rozzi | |
| 7,306,307 B2 | 12/2007 | Lapstun et al. | |
| 7,306,325 B2 | 12/2007 | Silverbrook et al. | |
| 7,309,020 B2 | 12/2007 | Anderson et al. | |
| 7,322,669 B2 | 1/2008 | Berry et al. | |
| 7,322,673 B2 | 1/2008 | Silverbrook et al. | |
| 7,328,966 B2 | 2/2008 | Silverbrook | |
| 7,341,328 B2 | 3/2008 | Berry et al. | |
| 7,357,476 B2 | 4/2008 | Berry et al. | |
| 2003/0076649 A1 | 4/2003 | Speakman | |
| 2007/0269750 A1 | 11/2007 | Irving et al. | |

OTHER PUBLICATIONS

International Search Report for PCT Application No. PCT/US2009/056701, Oct. 30, 2009 (2 sheets).

* cited by examiner

*Primary Examiner* — Frederick Parker

(74) *Attorney, Agent, or Firm* — Okamoto & Benedicto LLP

(57) ABSTRACT

A contact mask for inkjet printing on a solar cell substrate may be generated by creating a printing bitmap of contacts to be printed on the solar cell substrate. The contacts may be located on the solar cell substrate by mapping coordinates of the printing bitmap to coordinates of the solar cell substrate as positioned in the inkjet printer. The location of the contacts on the solar cell substrate may be defined relative to a location on the solar cell substrate, such as relative to center of mass. The contact mask may be printed by the inkjet printer using the printing bitmap and location information of the contacts.

13 Claims, 9 Drawing Sheets

GENERATION OF CONTACT MASKS FOR INKJET PRINTING ON SOLAR CELL SUBSTRATES

BACKGROUND OF THE INVENTION

1. Field of the Invention

The present invention relates generally to solar cell fabrication, and more particularly but not exclusively to generation of contact masks for solar cells.

2. Description of the Background Art

An inkjet printer includes a print head with a plurality of nozzles, each nozzle configured to dispense dots of ink on a surface. A pattern formed by the dispensed dots can be printed by appropriate movement of the inkjet's print head across the surface. Inkjet printing is relatively low cost compared to traditional lithography techniques and is thus suitable for cost-sensitive applications, such as solar cell fabrication.

Inkjet printing has been used to form contact masks on solar cells. A contact mask defines regions of a solar cell substrate where contact holes are to be formed. The contact mask protects other areas of the solar cell during etching of the contact holes. Once etched, the contact holes are filled with an electrically conductive material, referred to as a "metal contact," to allow an external electrical circuit to be electrically coupled to diffusion regions of the solar cell. Embodiments of the present invention pertain to improved techniques for generating contact masks suitable for inkjet printing on a solar cell.

SUMMARY

A contact mask for inkjet printing on a solar cell substrate may be generated by creating a printing bitmap of contacts to be printed on the solar cell substrate. The contacts may be located on the solar cell substrate by mapping coordinates of the printing bitmap to coordinates of the solar cell substrate as positioned in the inkjet printer. The location of the contacts on the solar cell substrate may be defined relative to a location on the solar cell substrate, such as relative to center of mass. The contact mask may be printed by the inkjet printer using the printing bitmap and location information of the contacts.

These and other features of the present invention will be readily apparent to persons of ordinary skill in the art upon reading the entirety of this disclosure, which includes the accompanying drawings and claims.

Figure 1A:
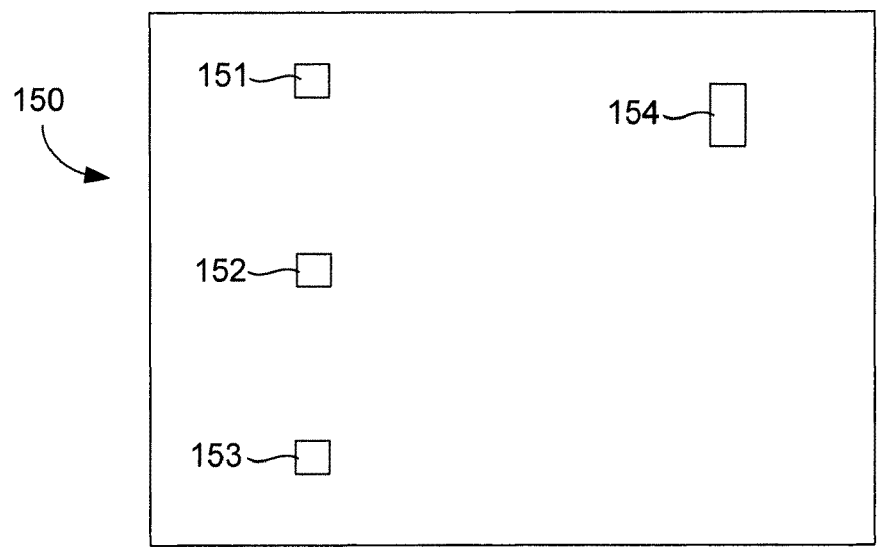
FIG. 1A schematically shows a drawing of contacts on a contact mask.

The use of the same reference label in different drawings indicates the same or like components. The drawings are not to scale.

DETAILED DESCRIPTION

In the present disclosure, numerous specific details are provided, such as examples of apparatus, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

A conventional approach to forming a contact mask is to create a drawing of the contact mask and then provide the drawing to an inkjet printer. The inkjet printer converts the drawing to a printing bitmap, which the printer uses to print the contact mask on the solar cell. The inventor has discovered that while this approach is workable, it may result in printing inaccuracies in certain situations. More specifically, when the feature size to be printed is very close to the printing resolution of the inkjet printer, conversion of the drawing to a bitmap is not reliably accurate. This problem is schematically illustrated in FIGS. 1A and 1B.

Figure 1B:
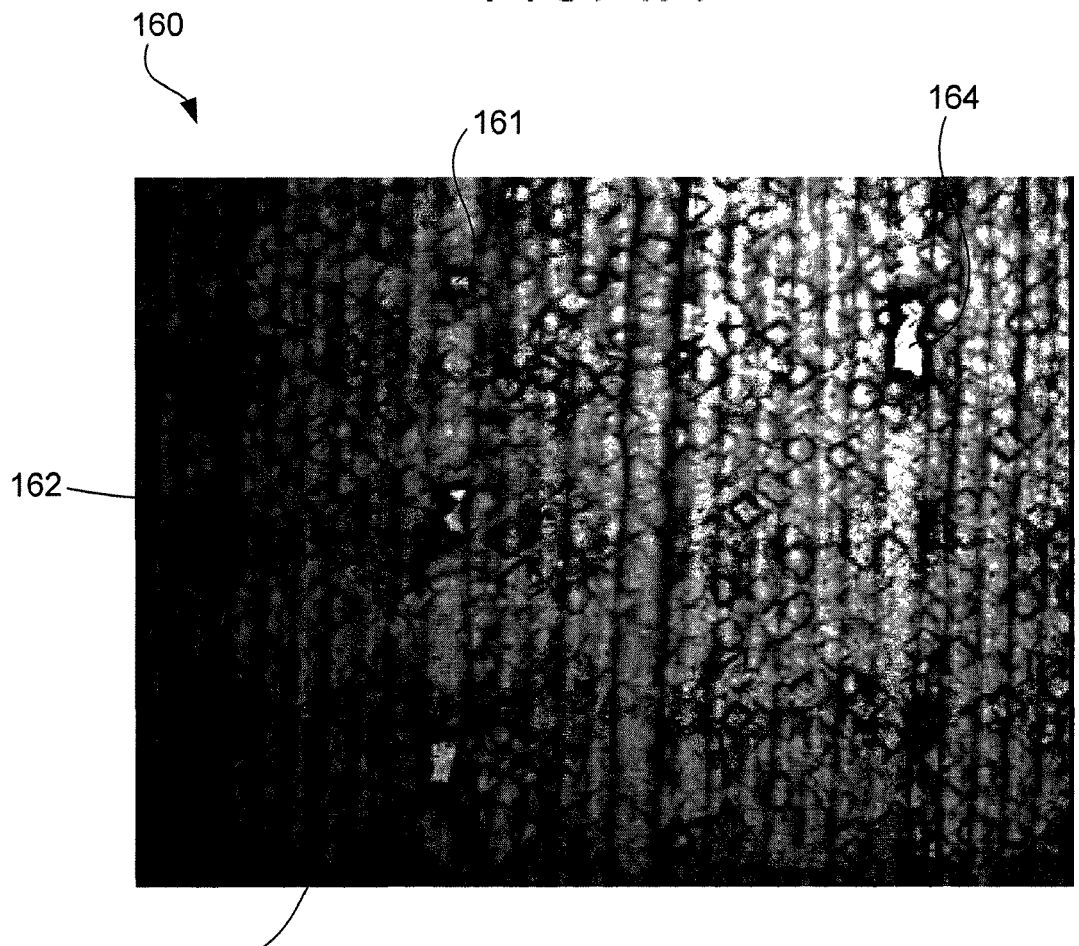
FIG. 1B schematically shows a photograph of resulting contact holes from the drawing of FIG. 1A.

FIG. 1A schematically shows a drawing 150 of contacts 151-154. Each of the contacts 151-154 is for a contact hole. The drawing 150 may be created using a drawing program, such as the Autocad™ software, for example. The drawing program outputs the drawing 150 as a TIFF (Tagged Image File Format) file. The TIFF file does not specify how to print the contacts 151-154 using an inkjet printer, which prints in terms of dots of ink. The TIFF file is provided to the inkjet printer, which converts the TIFF file to a bitmap, which shows how the contacts 151-154 will be drawn on a dot-by-dot basis, i.e., in terms of dots dispensed by the print head nozzles. Because of inaccuracies in the conversion from the drawing 150 to the bitmap, the contacts actually printed on the substrate do not accurately depict the ones in the drawing 150. FIG. 1B shows a photograph of the resulting contact holes 161-164 from the drawing 150. The contact holes 161-164 are formed on a solar cell substrate 160. In FIG. 1B, the contact holes 161-164 correspond to the contacts 151-54, respectively. Note that although contacts 151-153 are of the same size, the resulting contact holes 161-163 vary, with contact hole 161 being smaller than the contact 151 and the contact hole 163 being larger than the contact 153. In general, inaccuracies between a contacts drawing and the resulting contact holes may result in overly large or closed contact holes.

Figure 2A:
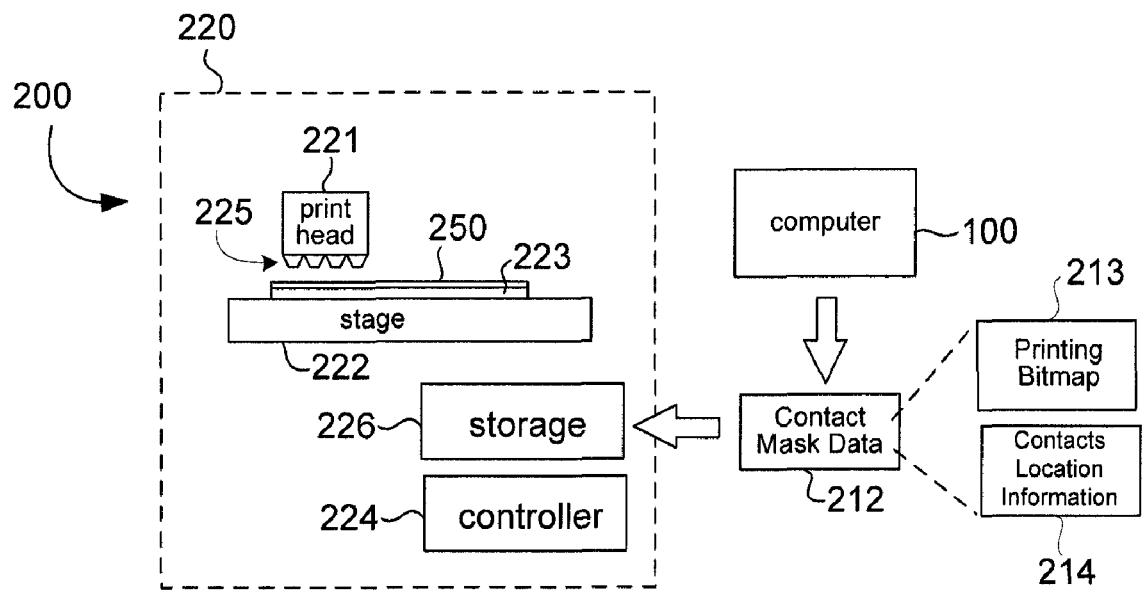
FIG. 2A schematically shows an inkjet printing system in accordance with an embodiment of the present invention.

Referring now to FIG. 2A, there is schematically shown an inkjet printing system 200 in accordance with an embodiment of the present invention. The system 200 may include a computer 100 and an inkjet printer 220. The computer 100 may be configured to generate contact mask data 212 that may be used by the inkjet printer 220 to print a contact mask 250 on a solar cell substrate 223.

The contact mask data 212 may include a printing bitmap 213 and contacts location information 214. In one embodiment, the printing bitmap 213 includes a representation of contacts on a contact mask in terms of dots to be printed by the inkjet printer 220. In one embodiment, the contacts location information 214 identify the locations of each contact in the printing bitmap 213. The contacts location information 214 may identify a location of a contact relative to a location on the substrate 223, such as relative to the center of mass of the substrate 223, for example.

The inkjet printer 220 may include a print head 221, a stage 222, a controller 224, and storage medium 226. The contact mask data 212 may be transferred from the computer 210 to the inkjet printer 220 a variety of ways, such as by data transfer over a computer network, removable data storage medium (e.g., CD-ROM, flash memory, DVD, USB drive or memory), or an I/O bus (e.g., USB, firewire), for example. The contact mask data 212 may be stored in the storage medium 226 (e.g., data storage device or main memory/RAM) accessible by the controller 224. The controller 224 processes the contact mask data 212 to identify the contacts to be printed based on the printing bitmap 213 and to identify where on the substrate 223 the contacts are to be printed based on the contacts location information 214. The controller 224 controls the dispensing of ink from the print head nozzles 225 and the movement of the stage 222 and the print head 221 to print the contact mask 250 on the substrate 223. In one embodiment, the inkjet printer 220 comprises the DoD 300™ inkjet printer, which is commercially available from Gebr. Schmid GmbH of Freudenstadt Germany. Other inkjet printers may also be used without detracting from the merits of the present invention.

Figure 2B:
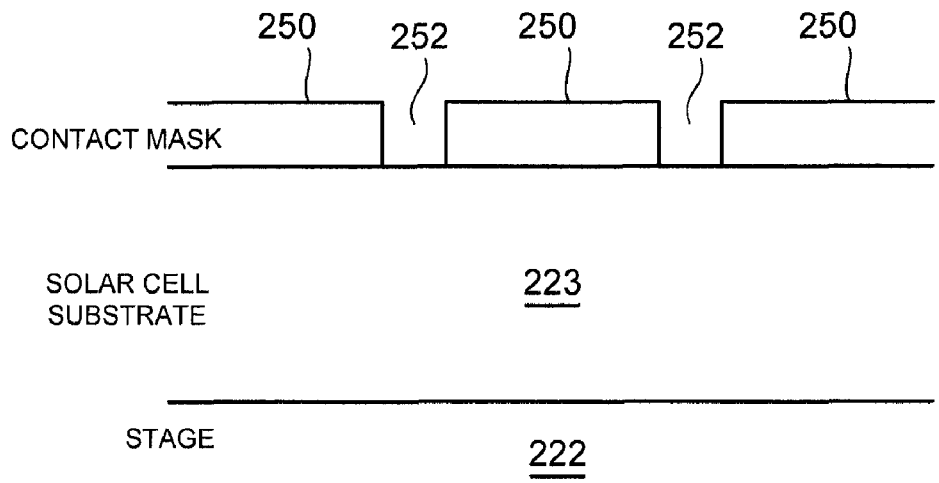
FIG. 2B schematically shows a contact mask on a solar cell substrate in accordance with an embodiment of the present invention.

FIG. 2B schematically shows a magnified view of the contact mask 250 on the solar cell substrate 223 in accordance with an embodiment of the present invention. The contact mask 250 includes contacts 252, which define regions of the solar cell substrate 223 where contact holes are to be formed. Portions of the solar cell substrate 223 exposed by the contacts 252 are subsequently etched to form contact holes to diffusion regions of the solar cell substrate 223. The solar cell substrate 223 is shown in FIG. 2B as being supported by the stage 222.

Figure 3:
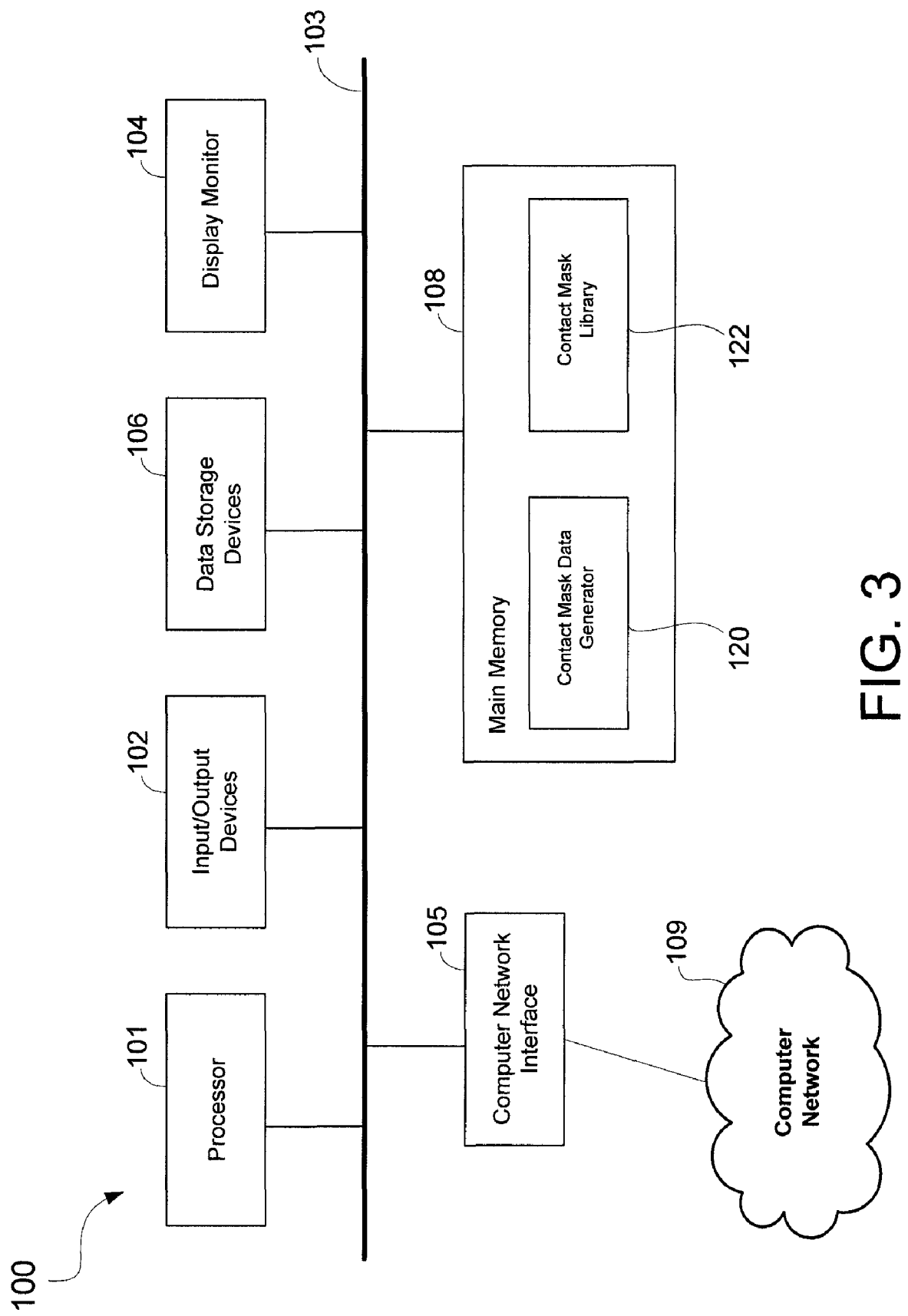
FIG. 3 schematically shows a computer in the inkjet printing system of FIG. 2A in accordance with an embodiment of the present invention.

FIG. 3 schematically shows the computer 100 of FIG. 2A in accordance with an embodiment of the present invention. The computer 100 may include a processor 101, such as those from the Intel Corporation or Advanced Micro Devices, for example. The computer 100 may have one or more buses 103 coupling its various components. The computer 100 may include one or more input/output devices 102 (e.g., keyboard, mouse, external device connected by I/O bus), one or more data storage devices 106 (e.g., hard drive, optical disk, USB memory), a display monitor 104 (e.g., LCD, flat panel monitor, CRT), a computer network interface 105 (e.g., network adapter, modem), and a main memory 108 (e.g., RAM). The computer network interface 105 may be coupled to a computer network 109, which may include the inkjet printer 220. The computer 100 may have less or more components to meet the needs of a particular application.

In the example of FIG. 3, the main memory 108 includes a contact mask data generator 120 and a contact mask library 122. The contact mask generator 120 and the contact mask library may be loaded from the data storage device 106 to the main memory 108 for execution by the processor 101. The contact mask data generator 120 may comprise computer-readable program code for generating contact mask data 212. In one embodiment, the contact mask data generator 120 is configured to access pre-defined contacts from the contact mask library 122. The contact mask data generator 120 may provide a user interface to allow the engineer designing the contact mask to select contacts from the contact mask library 122, to add selected contacts in the contact mask, and to define locations of the contacts in the contact mask. The contact mask data generator 120 may format the just mentioned inputs from the engineer into a form readable by the inkjet printer 220 as contact mask data 212.

Figure 4:
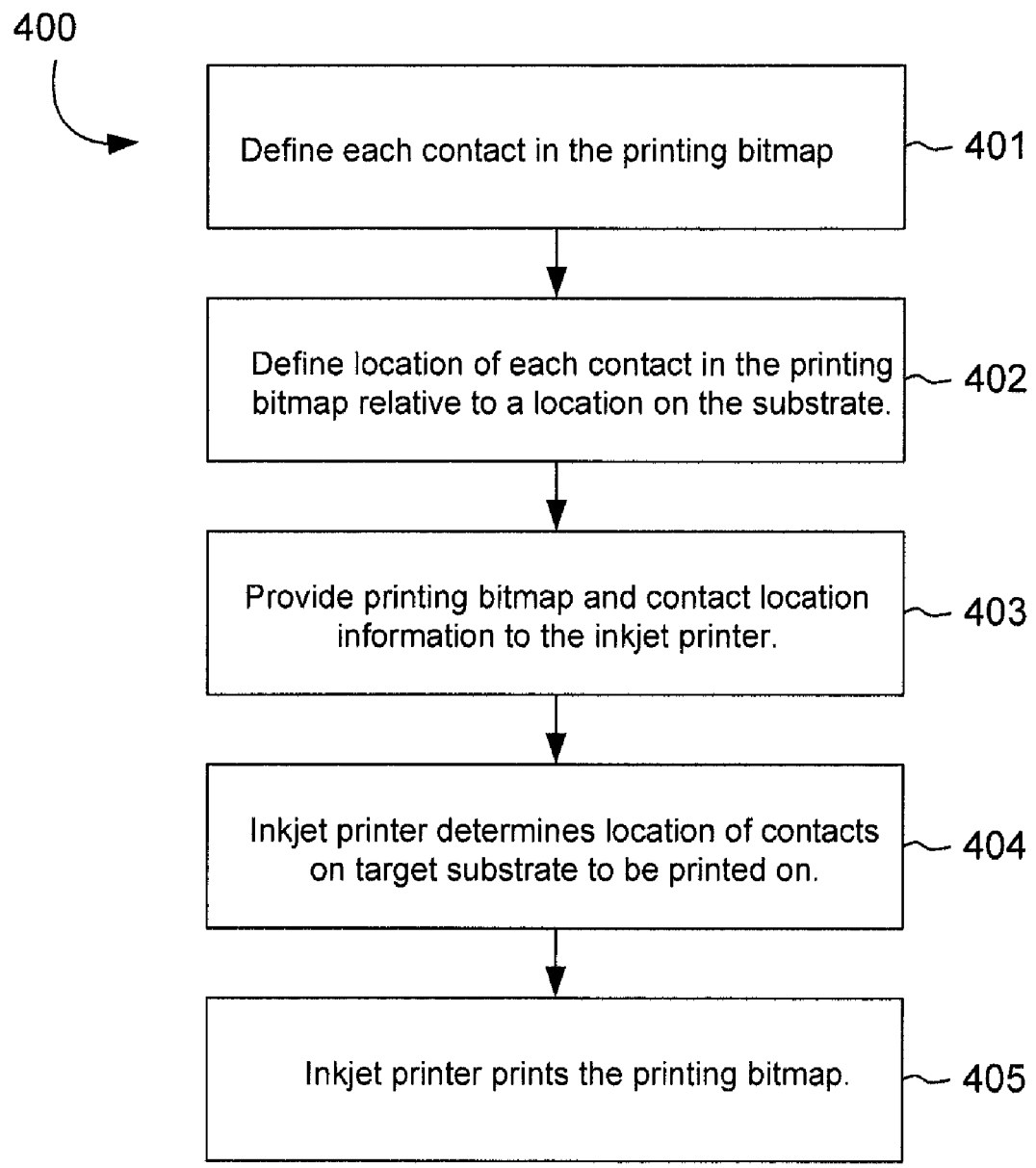
FIG. 4 shows a flow diagram of a method of generating a contact mask for inkjet printing on a solar cell in accordance with an embodiment of the present invention.

FIG. 4 shows a flow diagram of a method 400 of generating a contact mask for inkjet printing on a solar cell substrate in accordance with an embodiment of the present invention. FIG. 4 is explained using the components shown in FIGS. 2A and 3 for illustration purposes only. Other components may also be used without detracting from the merits of the present invention.

Figure 5:
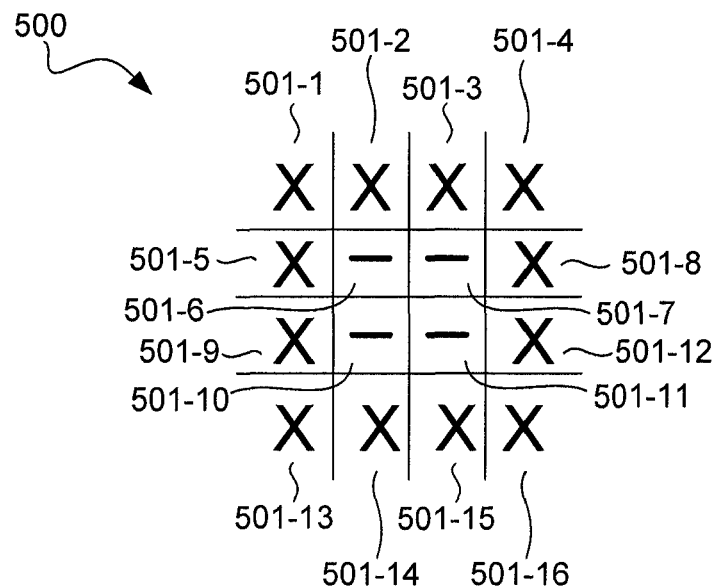
FIG. 5 shows a bitmap portion defining a contact in accordance with an embodiment of the present invention.
Figure 6:
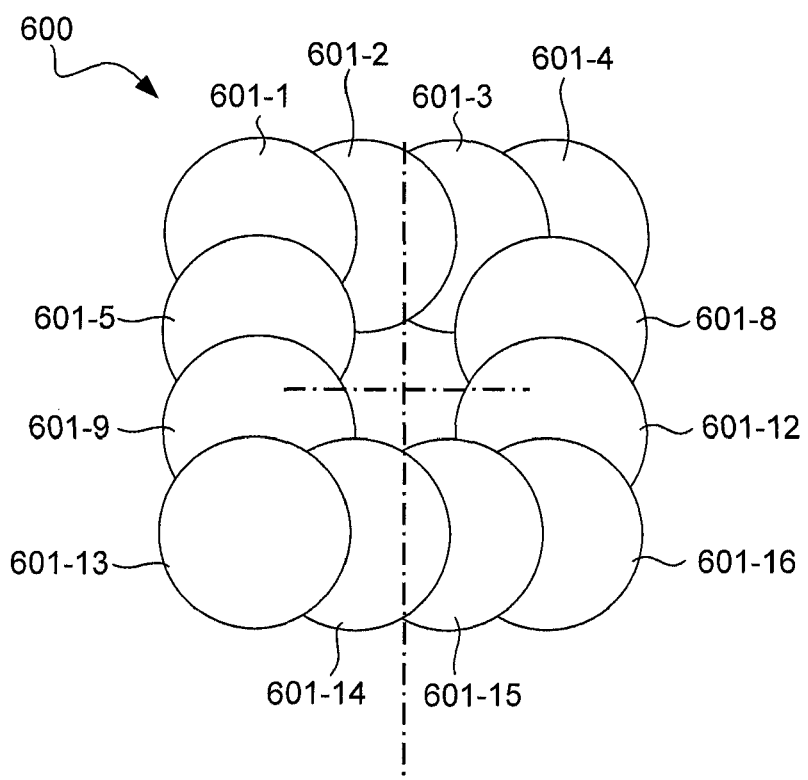
FIG. 6 shows a contact defined by the bitmap portion of FIG. 5 in accordance with an embodiment of the present invention.

In step 401, each contact in the printing bitmap 213 is defined. Step 401 may be performed by the person, such as an engineer, using the contact mask data generator 120. A contact defines where a contact hole (and metal contact filling the contact hole) will be formed on the solar cell substrate. The defined contacts may be stored in the contact mask library 122. FIGS. 5 and 6 schematically illustrate step 401.

FIG. 5 shows a bitmap portion 500 defining a contact in accordance with an embodiment of the present invention. As its name implies, the bitmap portion 500 is a portion of a printing bitmap 213. In the example of FIG. 5, the bitmap portion 500 shows printing cells 501 (i.e., 501-1, 501-2, ..., 501-16) of the printing bitmap 213, with each printing cell 501 identifying where a dot may be printed by the inkjet printer 220. As can be appreciated, the printing bitmap 213 will have more printing cells 501 than what are shown in FIG. 5. The size of printing cells 501 and their spacing depend on the particular inkjet printer used. Also, the shape of a dot is not necessarily round or circular as the shape of the dot depends on the configuration of the nozzles 225.

The inkjet printer 220 may print a dot such that its center substantially coincides with the center of a printing cell 501. In the example of FIG. 5, an "×" on a printing cell 501 indicates a location where a dot will be printed and a "–" on a printing cell 501 indicates a location where no dot will be printed. In the example of FIG. 5, dots will be printed on cells 501-1, 501-2, 501-3, 501-4, 501-5, 501-8, 501-9, 501-12, 501-13, 501-14, 501-15, and 501-16. No dot will be printed on printing cells 501-6, 501-7, 501-10, and 501-11.

A printing bitmap 213 may have bitmap definitions of all contacts to be printed on the solar cell substrate. As shown in FIG. 5, each contact may be defined in terms of dots printable by the inkjet printer. By defining the contacts in the printing map 213, the inkjet printer 220 does not necessarily need to perform a contact drawing to bitmap conversion, resulting in more accurately inkjet printed contacts.

FIG. 6 shows a contact 600 defined by the bitmap portion 500 in accordance with an embodiment of the present invention. The dots 601 (601-1, 601-2, etc.) correspond to printing cells 501 that have been marked with an "×". That is, dot 601-1 corresponds to the printing cell 501-1, dot 601-2 corresponds to the printing cell 501-2, and so on. The center of the contact 600 has no dots and exposes a region of the solar cell substrate where a contact hole will be formed by etching.

Continuing with step 402 of FIG. 4, the location of each contact in the printing bitmap is defined relative to a location on a solar cell substrate. In one embodiment, the center of each contact in the printing bitmap 213 is defined relative to the center of mass of the solar cell substrate. This is schematically illustrated in FIGS. 7 and 8.

Figure 7:
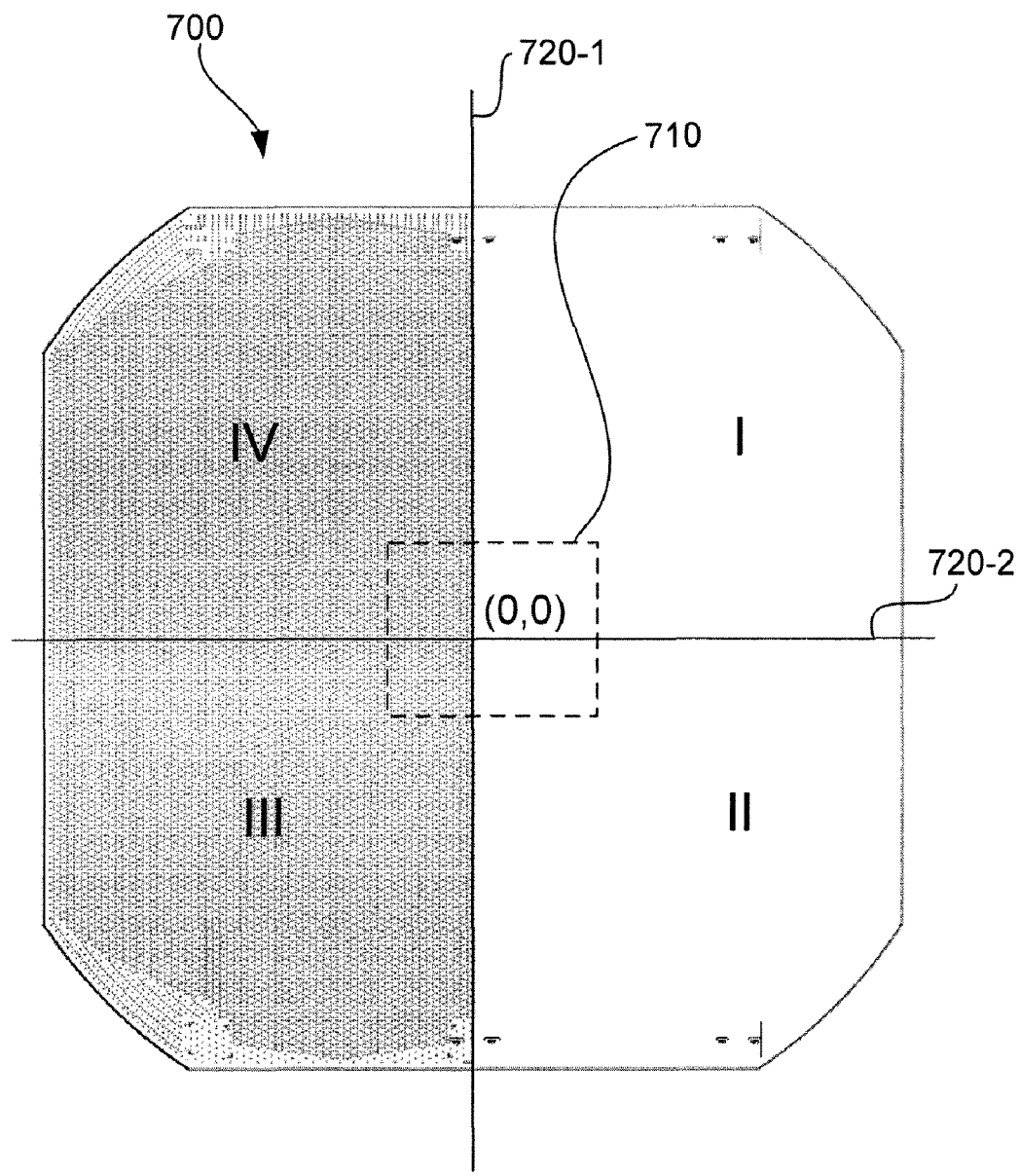
FIG. 7 shows a solar cell substrate divided into quadrants as per the Cartesian coordinate system, in accordance with an embodiment of the present invention.
Figure 8:
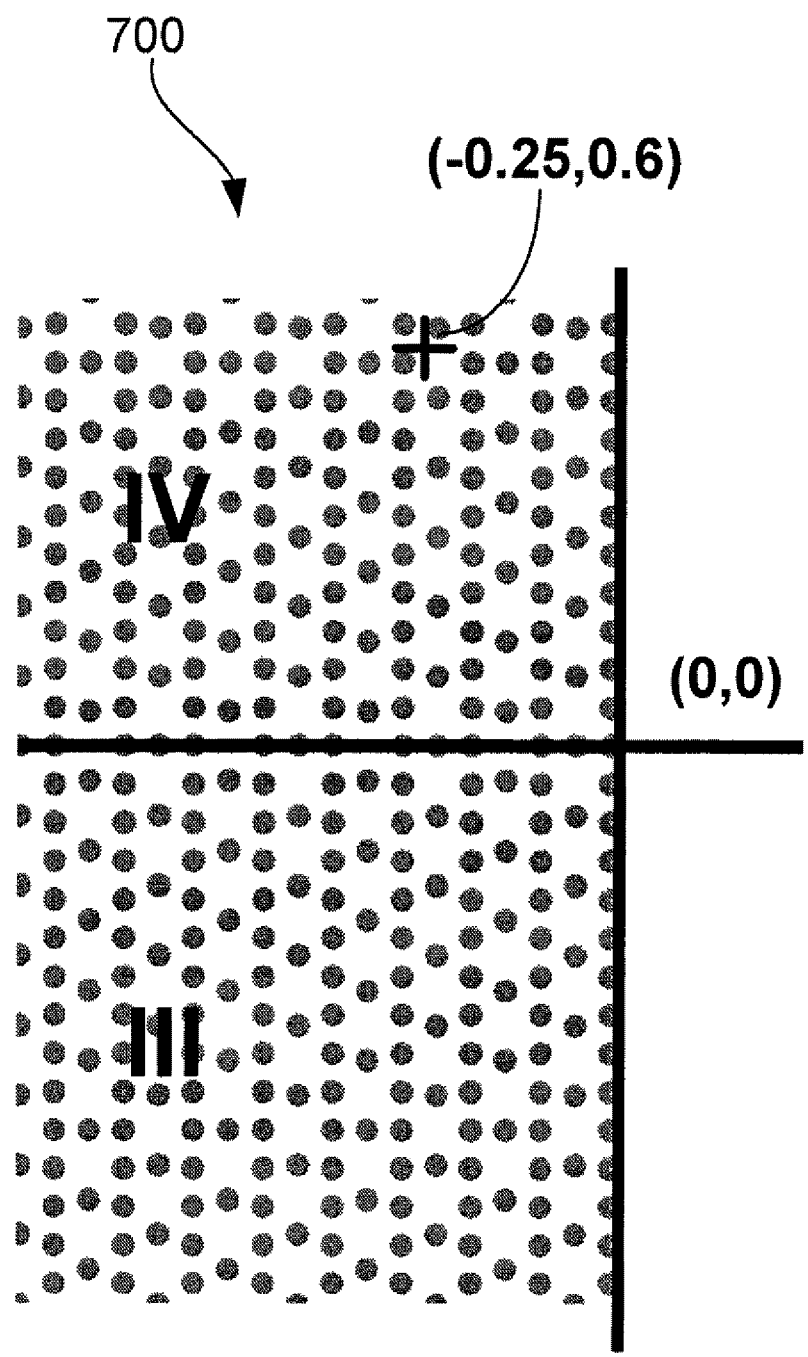
FIG. 8 shows a magnified view of a portion of the solar cell substrate of FIG. 7.

In FIG. 7, a solar cell substrate 700 is divided into four quadrants, I, II, III, and IV, as per the Cartesian coordinate system, in accordance with an embodiment of the present invention. The center of mass of the solar cell substrate 700 is at coordinates (0,0), with the Y-axis being labeled as 720-1 and the X-axis being labeled as 720-2. FIG. 8 shows a magnified view of the portion 710 of the solar cell substrate 700. In the example of FIG. 8, the center of a contact is defined as in the coordinates (−02.5, 0.6) relative to the center of mass, which is at coordinates (0,0). The location of contacts in the printing bitmap 213 may be stored as contacts location information 214.

Continuing with step 403 of FIG. 4, the printing bitmap 213 and the contacts location information 214 are provided to the inkjet printer 220. In this example, the contacts location information 214 identifies the location of each contact to be printed relative to the center of mass of the solar cell substrate 223.

In step 404, the inkjet printer 220 determines the locations of the contacts on the target solar cell substrate to be printed on. In this example, the target substrate is the solar cell substrate 223 positioned on the stage 222 (see FIG. 2A). Ideally, the solar cell substrate 223 is positioned accurately on the stage 222. However, this is not the case in real world situations. More specifically, the solar cell substrate 223 may be skewed relative to an alignment position on the stage 222.

Figure 9:
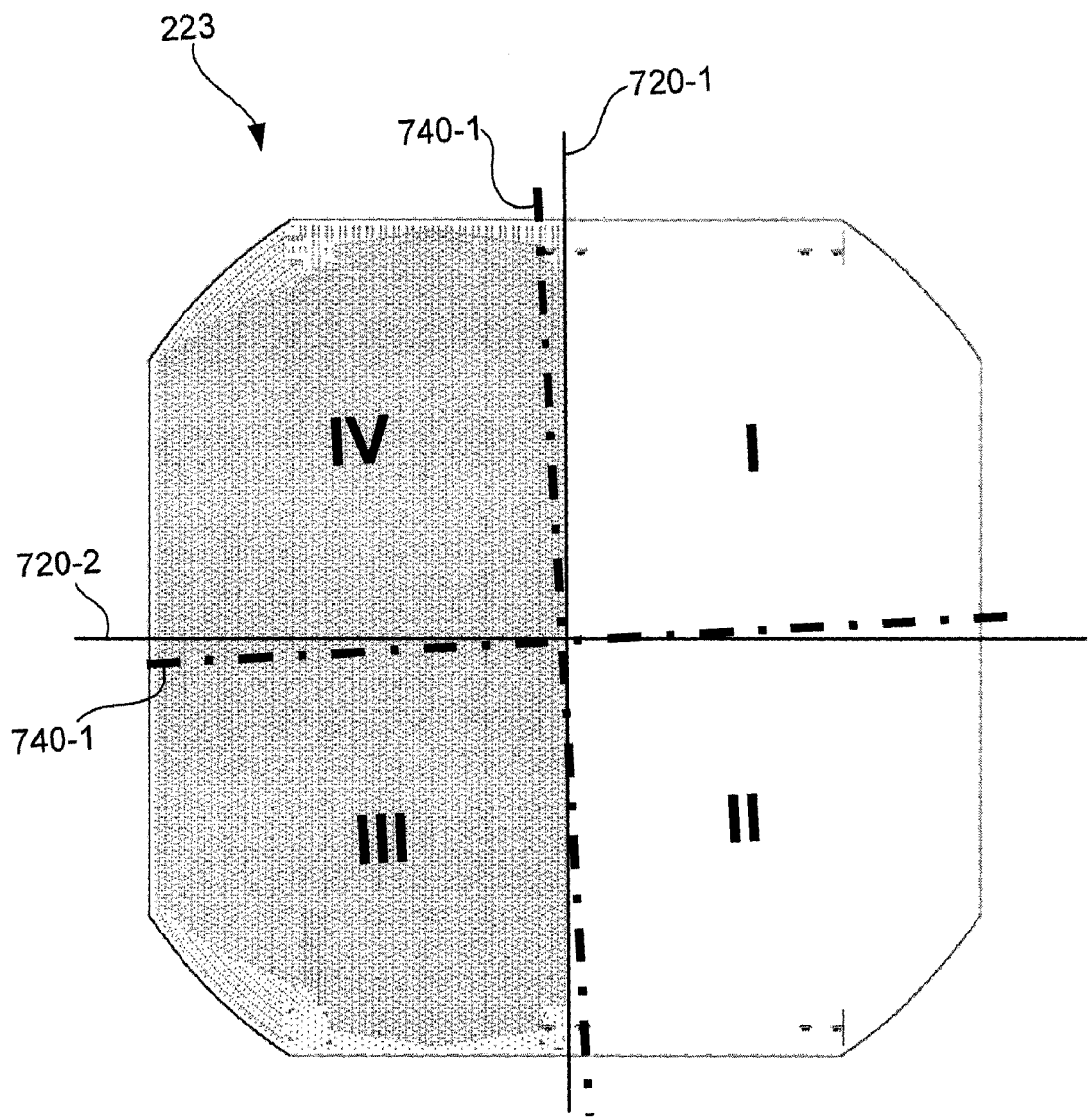
FIG. 9 schematically illustrates mapping of the coordinates of a solar cell substrate as defined in a printing bitmap to the coordinates of a target solar cell substrate.

In one embodiment, step 404 is performed by the inkjet printer 220 by mapping the coordinates of the printing bitmap 213 to the coordinates of the solar cell substrate 223 as positioned on the stage 222. This is schematically illustrated in FIG. 9, where the coordinates of the printing bitmap 213 (axes 720-1 and 720-2) do not coincide with the coordinates of the solar cell substrate 223 (axes 740-1 and 740-2) because of a positioning error, for example. The inkjet printer 220 may be configured to determine the alignment of the solar cell substrate 223 on the stage 222, identify the center of mass of the solar cell substrate 223, and then overlap the center of mass of the printing bitmap 213 to that of the solar cell substrate 223. The inkjet printer 220 may then convert the location of the contacts defined in the printing bitmap 213 to the coordinates of the solar cell substrate 223. In the example of FIG. 9, the location of contacts in the printing bitmap 213 may be rotated to match corresponding locations on the solar cell substrate 223.

Continuing with step 405 of FIG. 4, the inkjet printer 220 prints the contacts defined in the printing bitmap 213 onto corresponding locations on the solar cell substrate 223. The inkjet printer 220 may use a resist to print the contacts as individual dots, resulting in a contact mask 250 that exposes portions of the solar cell substrate 223 where no dot is printed. The exposed portions of the solar cell substrate 223 may then be etched to form contact holes. The contact holes may be filled with an electrically conductive material to form metal contacts to diffusion regions of the solar cell substrate 223 to allow an external electrical circuit to be coupled to and be powered by the solar cell.

Because the printing bitmap 213 already has the bitmap definition of the contacts on a dot by dot basis, the inkjet printer 220 does not need to perform a drawing to bitmap conversion. This advantageously helps ensure that the contact mask is inkjet printed correctly on the solar cell substrate. Furthermore, by defining the location of each contact relative to a location on the solar cell substrate, the inkjet printer 220 is able to identify the location on the substrate where a contact is to be printed even when the substrate is not perfectly aligned on the stage 222.

An inkjet printer 220 prints a contact mask by raster scanning. Because the inkjet printer does not have to generate a bitmap, rasterization may affect the contact location but not the contact size.

Figure 10:
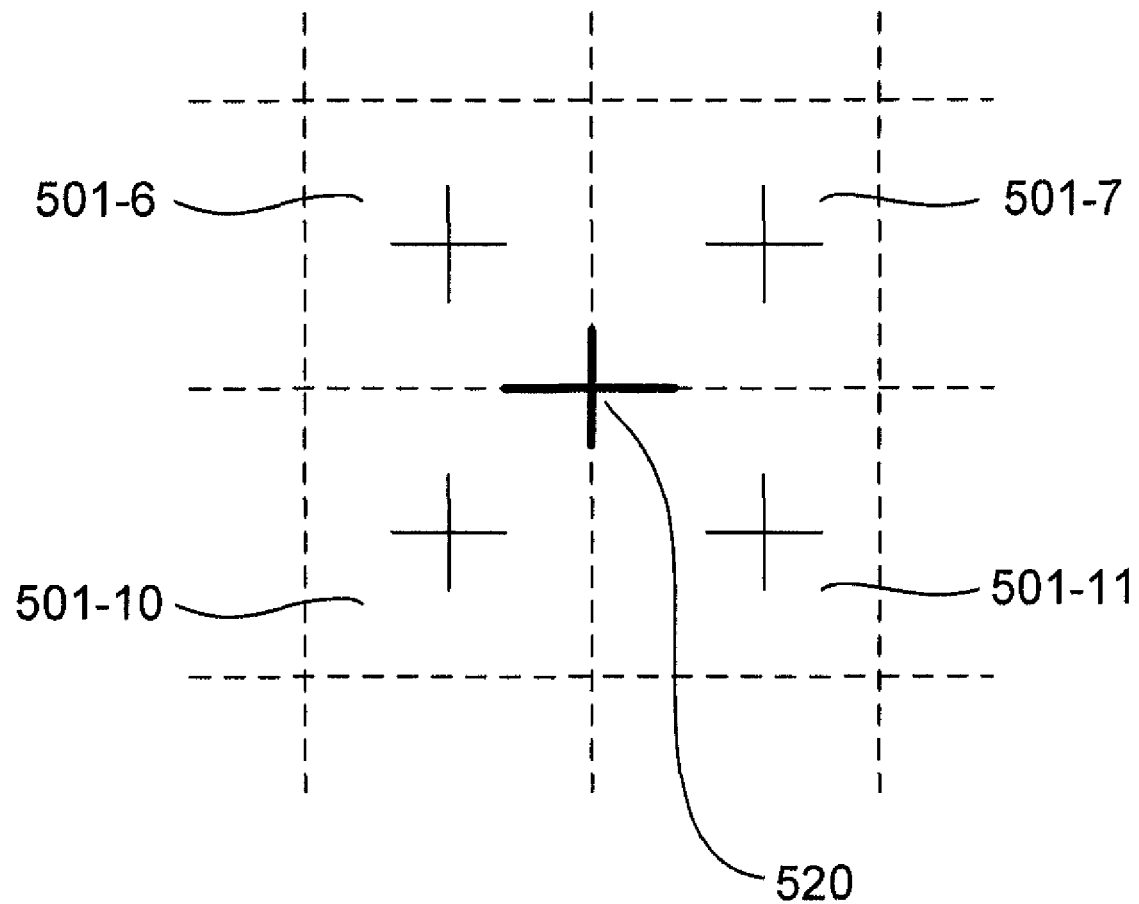
FIG. 10 schematically shows printing cells of the bitmap portion of FIG. 5 to illustrate effect of rasterization on the printed contact mask.

FIG. 10 schematically shows the printing cells 501-6, 501-7, 501-10, and 501-11 of the bitmap portion 500 shown in FIG. 5, which is for the contact 600 shown in FIG. 6. In the example of FIG. 10, the "+" in the printing cells 501 indicate the center of the printing cell. Ideally, the contact is centered on the location 520. However, a rasterization error may move the center of the contact someplace else, such as on the center of one of the printing cells 501. The resulting worst case contact location misalignment in that case is given by:

$$\text{Raster} < \frac{\sqrt{DPI\_X^2 + DPI\_Y^2}}{2} \quad \text{(EQ. 1)}$$

where $DPI\_X^2$ is the dots per inch (DPI) resolution of the inkjet printer 220 on the x-axis and $DPI\_y^2$ is the dots per inch resolution of the inkjet printer 220 on the y-axis. Assuming 720 DPI resolution for a 35 μm printing bitmap 213, the maximum variation in contact location is +/−25 μm, which is better than the +/−35 μm maximum variation achievable using conventional contact mask generation techniques.

Improved techniques for generating contact masks for inkjet printing on solar cells have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of generating a contact mask for inkjet printing on a solar cell substrate, the method comprising:
defining a plurality of contacts in a printing bitmap, each contact in the plurality of contacts being for a contact hole and defined in the printing bitmap on a dot-by-dot basis in terms of individual dots printable by an inkjet printer;
generating contact location information defining location of each contact in the plurality of contacts relative to a location on a solar cell substrate;
providing the printing bitmap and the contact location information to the inkjet printer; and
forming a contact mask on a target solar cell substrate by inkjet printing the plurality of contacts on the target solar cell substrate in accordance with the printing bitmap and the contact location information.

2. The method of claim 1 wherein the location on the solar cell substrate is a center of mass of the solar cell substrate.

3. The method of claim 1 further comprising:
locating each contact in the plurality of contacts defined in the printing map to corresponding locations on the target solar cell substrate.

4. The method of claim 3 wherein locating each contact in the plurality of contacts defined in the printing bitmap to the corresponding locations on the target solar cell substrate includes mapping coordinates of the printing bitmap to coordinates of the target solar cell substrate as placed in the inkjet printer.

5. The method of claim 3 wherein locating each contact in the plurality of contacts defined in the printing bitmap to corresponding locations on the target solar cell substrate includes rotating location of each contact in the plurality of contacts.

6. The method of claim 1 wherein the contact location information identifies a center of each contact in the plurality of contacts relative to the location of the solar cell substrate.

7. The method of claim 1 wherein the contact mask comprises a resist.

8. A method of generating a contact mask for inkjet printing on a solar cell substrate, the method comprising:

provoding a printing bitmap to an inkjet printer, the printing bitmap defining contacts to be printed on a solar cell substrate as a contact mask, each of the contacts being for a contact hole and defined in the printing bitmap on a dot-by-dot basis in terms of dots printable by the inkjet printer;

receiving the printing bitmap in the inkjet printer; and inkjet printing the contact mask on the solar cell substrate in accordance with the printing bitmap.

9. The method of claim 8 further comprising:

providing contact location information to the inkjet printer, the contact location information identifying location of the contacts relative to a location on the solar cell substrate.

10. The method of claim 9 wherein the location on the solar cell substrate comprises center of mass of the solar cell substrate.

11. The method of claim 9 wherein the printing bitmap is provided to the inkjet printer over a computer network.

12. The method of claim 9 wherein the printing bitmap is provided to the inkjet printer by way of a removable storage medium.

13. The method of claim 8 further comprising:

mapping coordinates of the printing bitmap to coordinates of the solar cell substrate to locate the contacts on the solar cell substrate.

* * * * *